United States Patent
Markov et al.

(10) Patent No.: US 11,205,490 B2
(45) Date of Patent: Dec. 21, 2021

(54) METHOD OF IMPROVING READ CURRENT STABILITY IN ANALOG NON-VOLATILE MEMORY CELLS BY SCREENING MEMORY CELLS

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/828,206

(22) Filed: Mar. 24, 2020

(65) Prior Publication Data

US 2021/0065837 A1    Mar. 4, 2021

Related U.S. Application Data (60) Provisional application No. 62/895,458, filed on Sep. 3, 2019.

(51) Int. Cl.
  *G11C 16/16*  (2006.01)
  *G11C 16/26*  (2006.01)
  (Continued)

(52) U.S. Cl.
  CPC .............. *G11C 16/26* (2013.01); *G11C 16/16* (2013.01); *G11C 16/28* (2013.01); *G11C 16/349* (2013.01);
  (Continued)

(58) Field of Classification Search
  CPC ... G11C 29/50004; G11C 16/28; G11C 16/16; G11C 16/26; G11C 16/349;
  (Continued)

(56) References Cited

U.S. PATENT DOCUMENTS 5,029,130 A   7/1991 Yeh
6,747,310 B2  6/2004 Fan et al.
(Continued)

FOREIGN PATENT DOCUMENTS

JP    2003187588    7/2003

OTHER PUBLICATIONS

*Negative bias temperature instability: What do we understand?* By Dieter K. Schroder, in Microelectronics Reliability 47 (2007) 841-852, Department of Electrical Engineering and Center for Solid State Electronics Research, Arizona State University, Tempe, AZ 85287-5706, USA.

*Primary Examiner* — Mushfique Siddique
(74) *Attorney, Agent, or Firm* — DLA Piper LLP (US)

(57) ABSTRACT

A memory device that includes a plurality of non-volatile memory cells and a controller. The controller is configured to erase the plurality of memory cells, program each of the memory cells, and for each of the memory cells, measure a threshold voltage applied to the memory cell corresponding to a target current through the memory cell in a first read operation, re-measure a threshold voltage applied to the memory cell corresponding to the target current through the memory cell in a second read operation, and identify the memory cell as defective if a difference between the measured threshold voltage and the re-measured threshold voltage exceeds a predetermined amount.

20 Claims, 13 Drawing Sheets

(51) Int. Cl.
*H01L 27/11529* (2017.01)
*H01L 27/11524* (2017.01)
*G11C 16/28* (2006.01)
*G11C 29/50* (2006.01)
*G11C 16/34* (2006.01)
*G11C 29/04* (2006.01)
*G11C 29/44* (2006.01)

(52) U.S. Cl.
CPC .. *G11C 29/50004* (2013.01); *H01L 27/11524* (2013.01); *H01L 27/11529* (2013.01); *G11C 16/3454* (2013.01); *G11C 29/04* (2013.01); *G11C 2029/0405* (2013.01); *G11C 2029/4402* (2013.01); *G11C 2029/5002* (2013.01); *G11C 2029/5004* (2013.01); *G11C 2029/5006* (2013.01)

(58) Field of Classification Search
CPC ........ G11C 2029/5004; G11C 16/3454; G11C 2029/4402; G11C 2029/5006; G11C 2029/5002; G11C 2029/0405; G11C 29/04; H01L 27/11529; H01L 27/11524
See application file for complete search history.

(56) References Cited

U.S. PATENT DOCUMENTS

| | | | |
|---|---|---|---|
| 6,855,980 | B2 | 2/2005 | Wang et al. |
| 7,315,056 | B2 | 1/2008 | Klinger |
| 7,868,375 | B2 | 1/2011 | Liu et al. |
| 8,711,636 | B2 | 4/2014 | Do et al. |
| 2002/0036925 | A1* | 3/2002 | Tanzawa ................. G11C 16/28 365/185.22 |
| 2005/0083735 | A1 | 4/2005 | Chen et al. |
| 2010/0259979 | A1* | 10/2010 | Jia ...................... G11C 16/0425 365/185.03 |
| 2012/0113714 | A1* | 5/2012 | Choy .................... G11C 16/10 365/185.03 |
| 2014/0082440 | A1 | 3/2014 | Ho |
| 2016/0077912 | A1 | 3/2016 | Mateescu |
| 2016/0293271 | A1 | 10/2016 | Won |
| 2017/0206981 | A1 | 7/2017 | Nafziger |
| 2019/0139602 | A1* | 5/2019 | Tiwari ................... G11C 16/34 |
| 2020/0065023 | A1 | 2/2020 | Markov et al. |

\* cited by examiner

METHOD OF IMPROVING READ CURRENT STABILITY IN ANALOG NON-VOLATILE MEMORY CELLS BY SCREENING MEMORY CELLS

RELATED APPLICATIONS

This application claims the benefit of U.S. Provisional Application No. 62/895,458 filed on Sep. 3, 2019, and which is incorporated herein by reference.

FIELD OF THE INVENTION

The present invention relates to non-volatile memory devices, and more particularly to improving the stability of the memory cell current during read operations.

BACKGROUND OF THE INVENTION

Non-volatile memory devices are well known in the art. See for example U.S. Pat. No. 7,868,375, which discloses a four-gate memory cell configuration. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed over and insulated from (and controls the conductivity of) a first portion of the channel region 18 (and partially over and insulated from the source region 14). A control gate 22 is disposed over and insulated from the floating gate 20. A select gate 24 is disposed over and insulated from (and controls the conductivity of) a second portion of the channel region 18. An erase gate 26 is disposed over and insulated from the source region 14 and is laterally adjacent to the floating gate 20. A plurality of such memory cells can be arranged in rows and columns to form a memory cell array.

Figure 1:
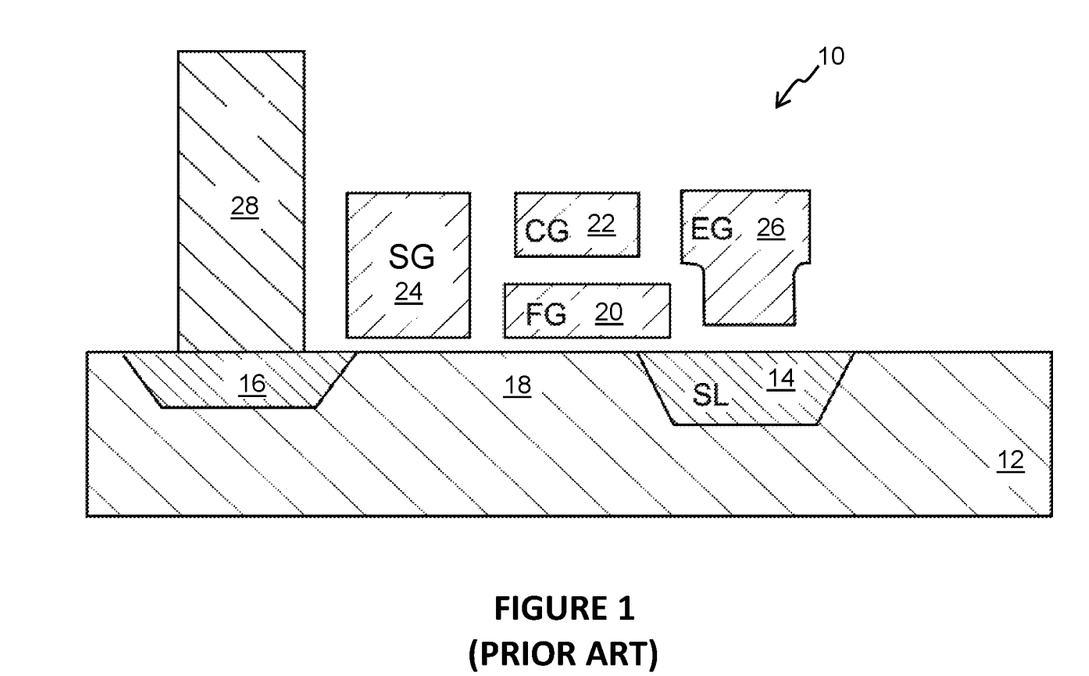
FIG. 1 is a side cross sectional view of a memory cell of the prior art.

Various combinations of voltages are applied to the control gate 22, select gate 24, erase gate 26 and/or source and drain regions 14/16, to program the memory cell (i.e., injecting electrons onto the floating gate), to erase the memory cell (i.e., removing electrons from the floating gate), and to read the memory cell (i.e., measuring or detecting the conductivity of the channel region 18 to determine the programming state of the floating gate 20).

Memory cell 10 can be operated in a digital manner, where the memory cell is set to one of only two possible states: a programmed state and an erased state. The memory cell is erased by placing a high positive voltage on the erase gate 26, and optionally a negative voltage on the control gate 22, to induce tunneling of electrons from the floating gate 20 to the erase gate 26 (leaving the floating gate in a more positively charged stated—the erased state). Memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate in a more negatively charged state—the programmed state). Memory cell 10 can be read by placing positive voltages on the select gate 24 (turning on the channel region portion under the select gate 24) and drain region 16 (and optionally on the erase gate 26 and/or the control gate 22), and sensing current flow through the channel region 18. If the floating gate 20 is positively charged (memory cell is erased), the memory cell will be turned on, and electrical current will flow from source region 14 to drain region 16 (i.e. the memory cell 10 is sensed to be in its erased "1" state based on sensed current flow). If the floating gate 20 is negatively charged (memory cell is programmed), the channel region under the floating gate is turned off, thereby preventing any current flow (i.e., the memory cell 10 is sensed to be in its programmed "0" state based on no current flow).

Table 1 provides non-limiting examples of erase, program and read voltages, where Vcc is power supply voltage or another positive voltage such as 2.5 V.

TABLE 1

|  | WL (SG) | BL (Drain) | Source | EG | CG |
|---|---|---|---|---|---|
| Erase | 0 V | 0 V | 0 V | 11.5 V | 0 V |
| Program | 1 V | 1 µA | 4.5 V | 4.5 V | 10.5 V |
| Read | Vcc | 0.6 V | 0 V | 0 V | Vcc |

Memory cell 10 can alternately be operated in an analog manner where the memory state (i.e. the amount of charge, such as the number of electrons, on the floating gate) of the memory cell can be continuously changed anywhere from a fully erased state (fewest electrons on the floating gate) to a fully programmed state (highest number of electrons on the floating gate), or just a portion of this range. This means the cell storage is analog, which allows for very precise and individual tuning of each memory cell in the memory cell array. Alternatively, the memory could be operated as an MLC (multilevel cell) where it is configured to be programmed to one of many discrete values (such as 16 or 64 different values). In the case of analog or MLC programming, the programming voltages are applied for only a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Memory cell 10 operated in an analog manner or as an MLC could be more sensitive to noise and read current instabilities which can adversely affect the accuracy of the memory device. One source of read current instability in analog non-volatile memory devices is the capture and emission of electrons by electron traps on the gate oxide-channel interface. The gate oxide is the insulation layer that separates the floating gate 20 and the channel region 18 of substrate 12. When an electron is captured on an interface trap, it reduces the channel conductivity during a read operation, and thus increases the threshold voltage Vt of the memory cell (i.e., the minimum voltage on the control gate needed to turn on the channel region of the memory cell to produce a certain level of current, 1 µA being an example). When the control gate voltage is at or above the threshold voltage, a conducting path is created between the source and drain regions. When the control gate voltage is below the threshold voltage, a conducting path is not created, and any source/drain current is considered sub-threshold or leakage current. An electron captured on an interface trap can be emitted from the trap, which decreases Vt of the memory cell, and thus increases the channel conductivity during a read operation. These single-electron events of electron capture and emission by trap appear as read current noise and are referred to as random telegraph noise (RTN) elsewhere. In general, RTN produced by a single interface trap is characterized by two states: lower Vt state (or higher read current state) when electron is emitted from the trap and higher Vt state (or lower read current state) when electron is captured by the trap. As shown above, the instability of the memory cell during read can be characterized either by threshold voltage corresponding to the target current or by memory cell current under given read voltage conditions. A preferable way of the characterization of memory cell read instability is threshold voltage which is used in the detailed description of the invention.

There is a need to reduce RTN in analog and MLC non-volatile memory devices.

BRIEF SUMMARY OF THE INVENTION

The aforementioned problems and needs are addressed by a memory device that includes a plurality of non-volatile memory cells and a controller. The controller is configured to erase the plurality of memory cells, program each of the memory cells, and for each of the memory cells, measure a threshold voltage applied to the memory cell corresponding to a target current through the memory cell in a first read operation, re-measure a threshold voltage applied to the memory cell corresponding to the target current through the memory cell in a second read operation, and identify the memory cell as defective if a difference between the measured threshold voltage and the re-measured threshold voltage exceeds a predetermined amount.

A memory device includes a plurality of non-volatile memory cells and a controller. The controller is configured to erase the plurality of memory cells, program each of the memory cells to a program state that corresponds to a predetermined threshold voltage of the memory cell, and then for each of the memory cells, measure current through the memory cell in a first read operation using a first read voltage applied to the memory cell that is offset from the predetermined threshold voltage by a positive or a negative offset value, and identify the memory cell as defective if the measured current in the first read operation is lower than, if the offset value is positive, or higher than, if the offset value is negative, a reference current value or a reference current value range.

Other objects and features of the present invention will become apparent by a review of the specification, claims and appended figures.

DETAILED DESCRIPTION OF THE INVENTION

The present invention is a technique for stabilizing the read current of an array of memory cells of the type of FIG. 1 to improve read operation accuracy and memory retention longevity. The read stabilization technique involves analyzing an array of memory cells to detect and screen out memory cells in the memory array that exhibit an intolerable level of RTN.

Figure 2:
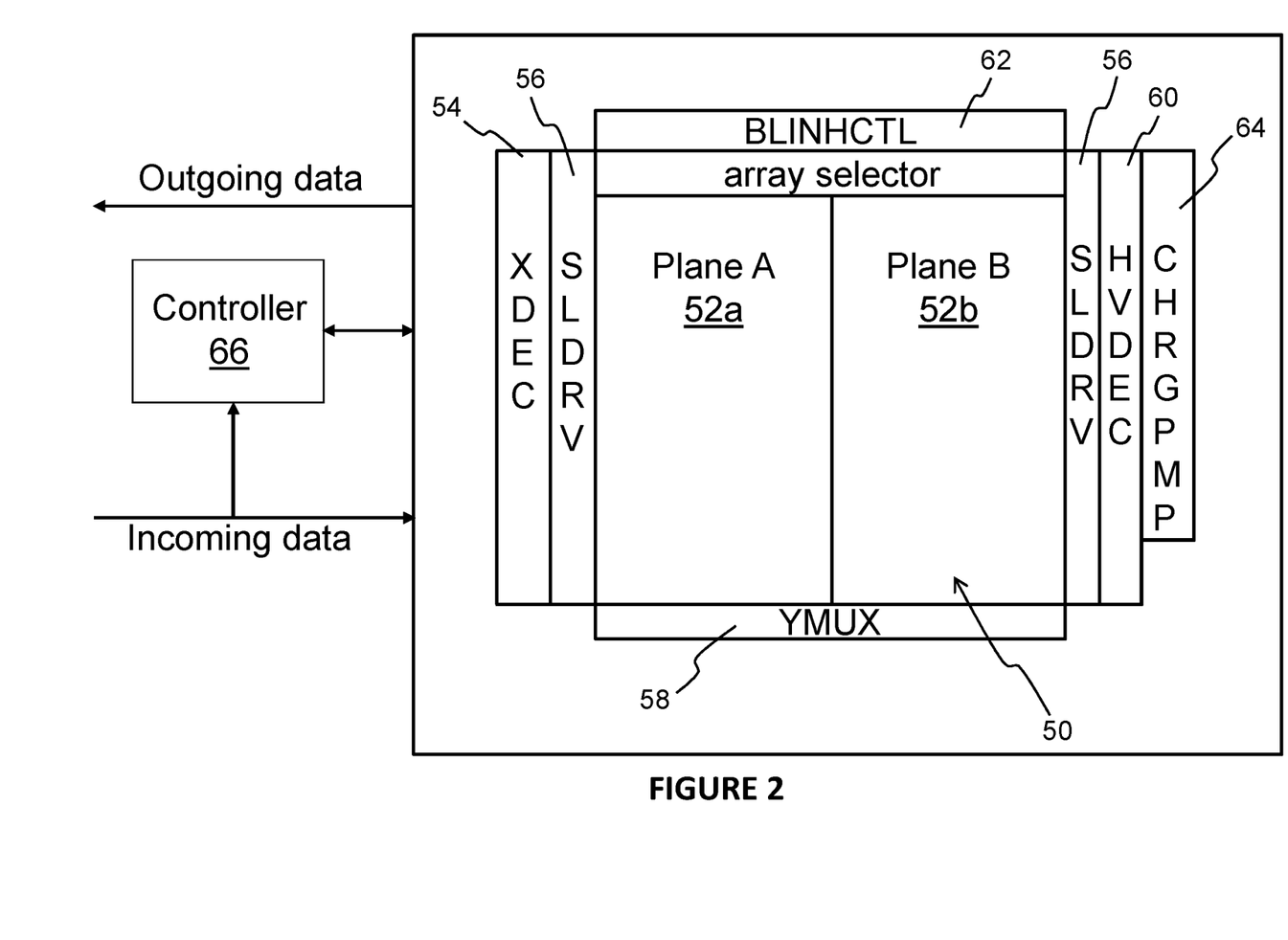
FIG. 2 is a diagram illustrating the components of a memory device.

The read stabilization technique implemented as part of the controller configuration for the memory array, which can be better understood from the architecture of an exemplary memory device as illustrated in FIG. 2. The memory device includes an array 50 of the non-volatile memory cells 10, which can be segregated into two separate planes (Plane A 52a and Plane B 52b). The memory cells 10 can be of the type shown in FIG. 1, formed on a single chip, arranged in a plurality of rows and columns in the semiconductor substrate 12. Adjacent to the array of non-volatile memory cells are address decoders (e.g. XDEC 54), a source line driver (e.g. SLDRV 56), a column decoder (e.g. YMUX 58), a high voltage row decoder (e.g. HVDEC 60) and a bit line controller (e.g. BLINHCTL 62), which are used to decode addresses and supply the various voltages to the various memory cell gates and regions during read, program, and erase operations for selected memory cells. Column decoder 58 includes a sense amplifier containing circuitry for measuring the currents on the bit lines during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. Controller 66 is configured to operate the memory device to program, erase and read the memory cells 10. As part of these operations, the controller 66 can be provided access to the incoming data which is data to be programmed to the memory cells, along with program, erase and read commands provided on the same or different lines. Data read from the memory array is provided as outgoing data.

The read stabilization technique involves the controller 66 analyzing the array of memory cells to detect and screen memory cells that exhibit an intolerable level of read current instability. This technique involves programming the memory cells and taking multiple measurements of a memory cell threshold voltage parameter (i.e., a minimum voltage applied to the memory cell to achieve a certain level of source/drain current, referred to as a target current). The preferable threshold voltage parameter is Vtcg, which is the threshold voltage of the memory cell as viewed from the control gate 22. Specifically, the control gate threshold voltage Vtcg is the voltage on the control gate that results in the channel region being a conducting path, and therefore results in a channel region current of a predetermined amount ($I_{target}$) to consider the memory cell turned on (e.g., 1 µA) when the read potentials of a read operation are applied to the select gate 24 and drain region 16. The control gate threshold voltage Vtcg will vary as function of programming state of the memory cell, but it is desired that once the memory cell is programmed to a particular programming state, any variation of Vtcg over time be below a predetermined amount.

Figure 3:
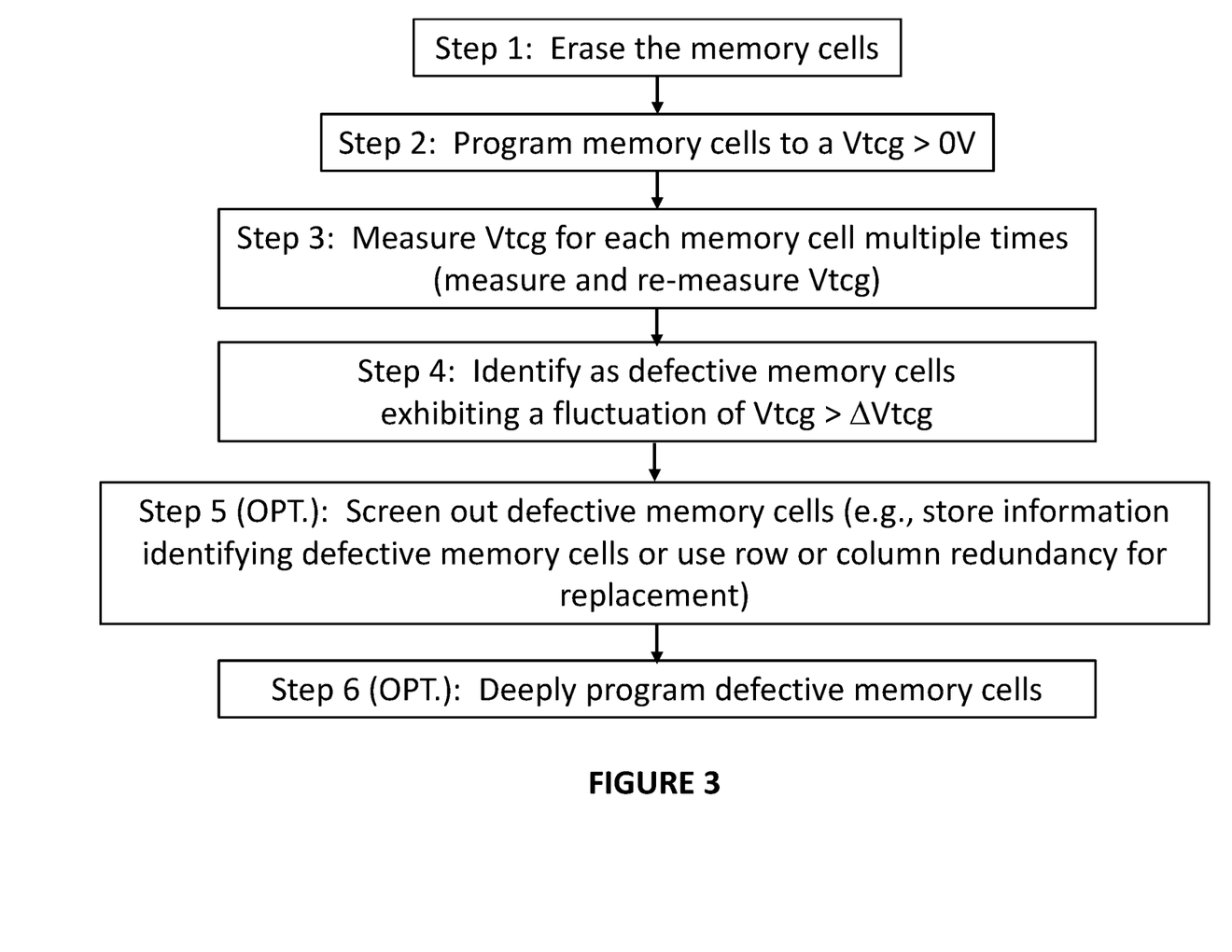
FIG. 3 is a flow diagram showing steps for identifying defective memory cells.
Figure 4:
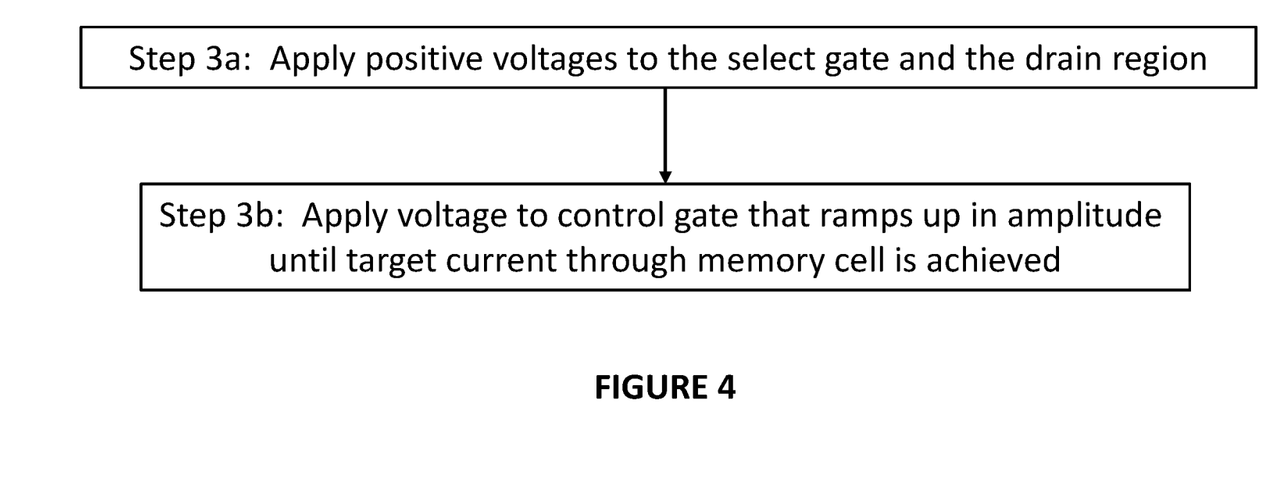
FIG. 4 is a flow diagram showing steps for measuring Vtcg.
Figure 8:
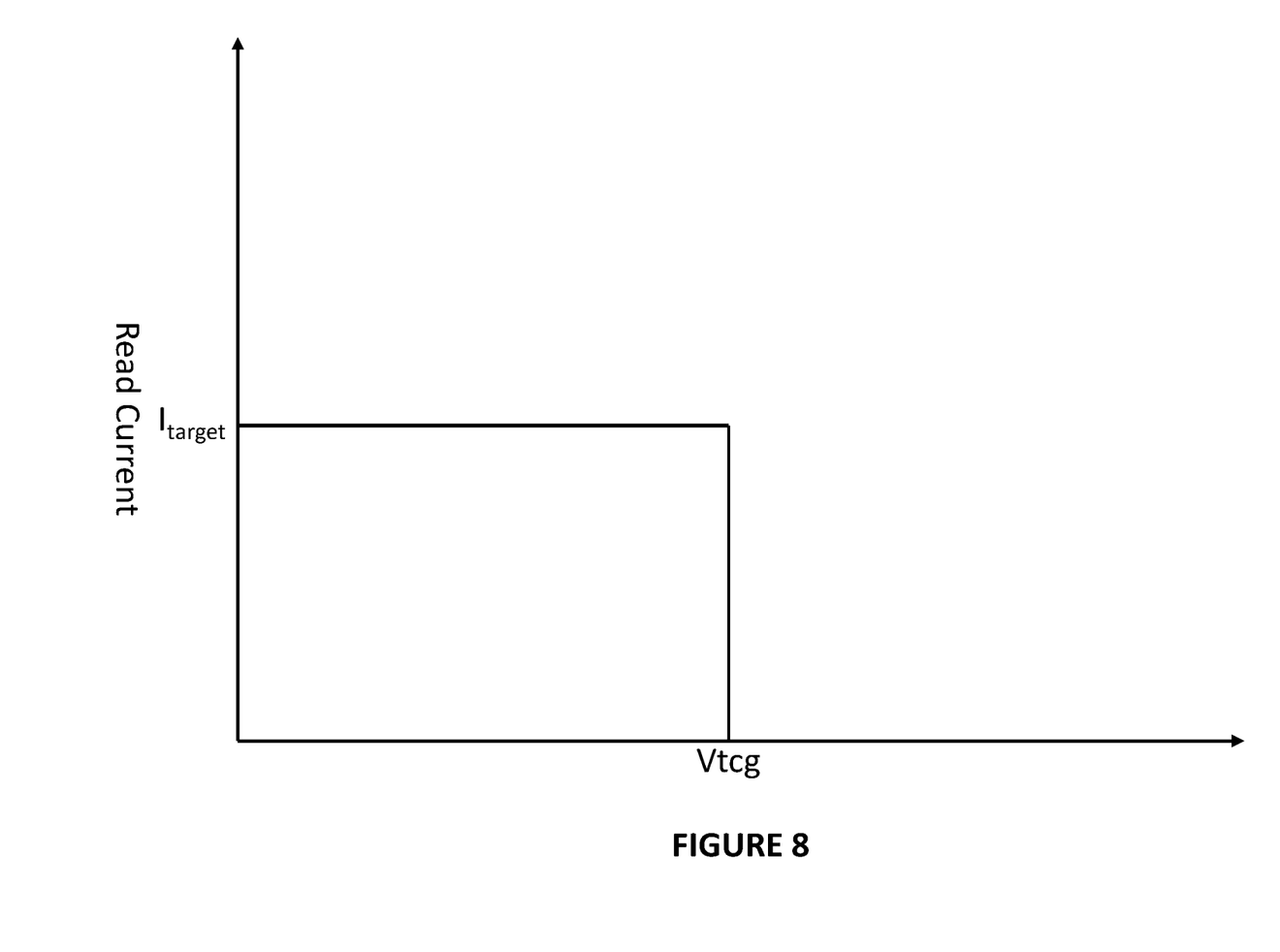
FIG. 8 is a graph showing the memory cell programmed to Vtcg to produce a read current of $I_{target}$.
Figure 9:
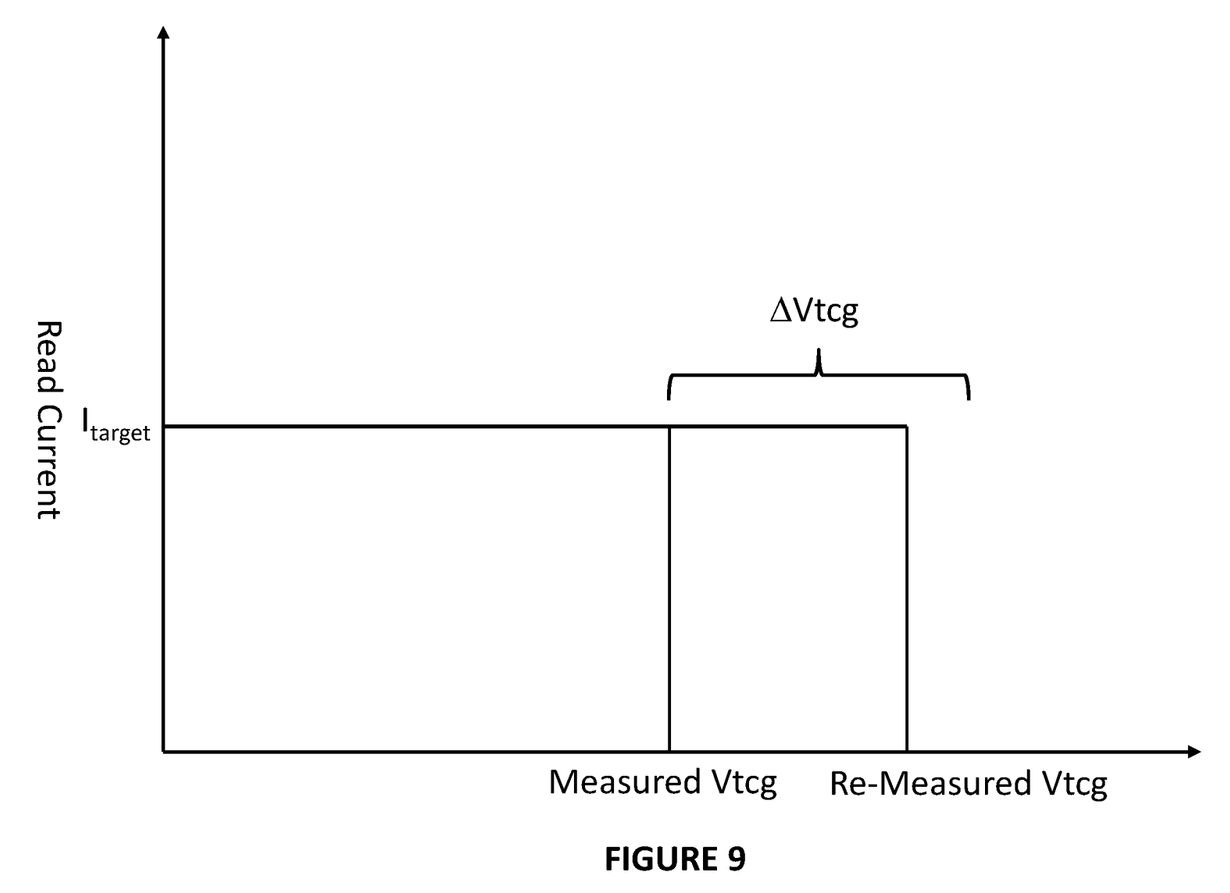
FIG. 9 is a graph showing measured and re-measured Vtcg differing from each other by less than $\Delta$Vtcg.
Figure 10:
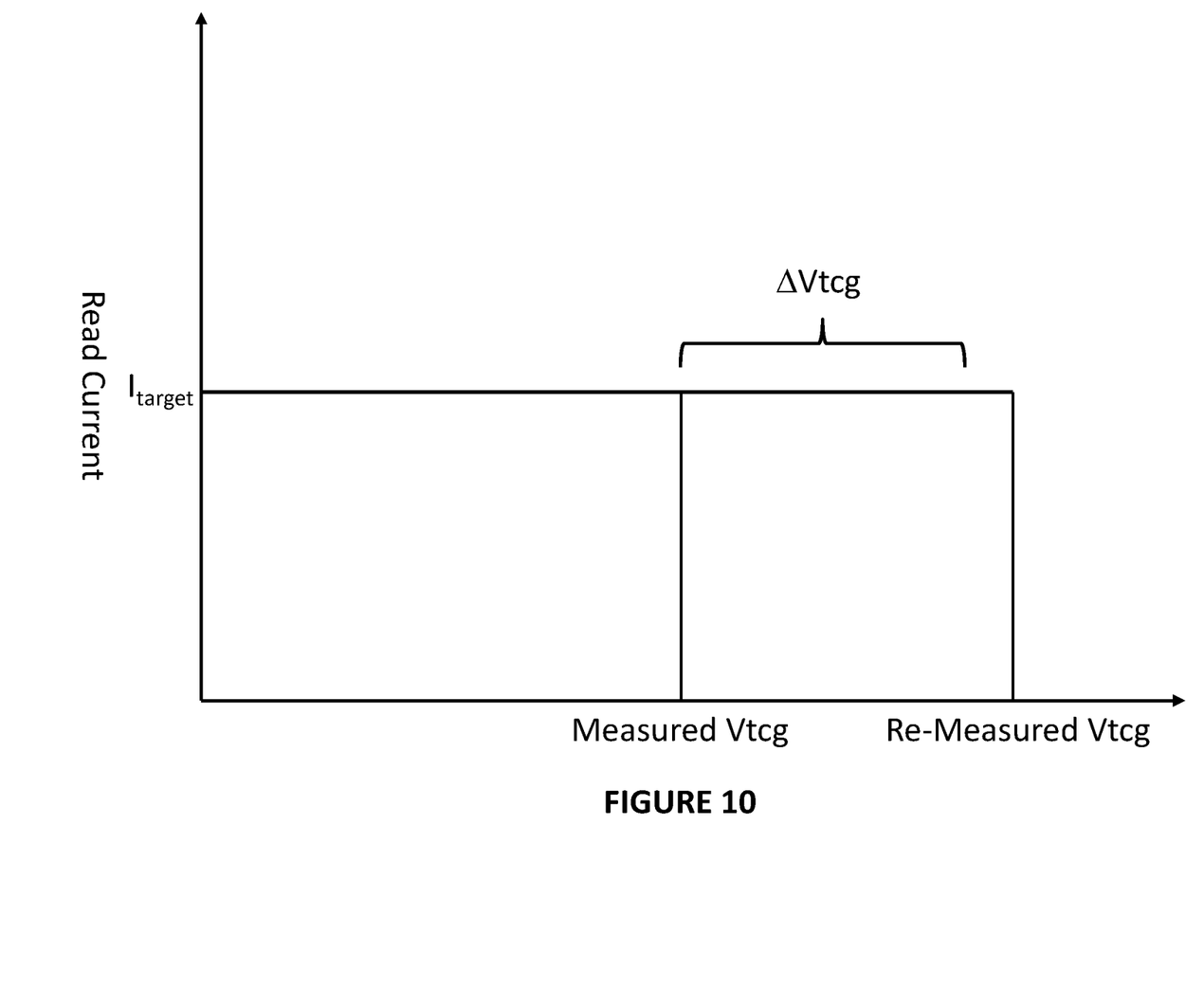
FIG. 10 is a graph showing measured and re-measured Vtcg differing from each other by more than $\Delta$Vtcg.

A first embodiment of this technique is illustrated in FIG. 3 and begins (step 1) by erasing the memory cells 10. Then (step 2), a programming operation is performed to all the memory cells, so that Vtcg is greater than the minimum level for the read operation used by controller 66, for example, 0V, for all the memory cells. See also FIG. 8, which graphically shows the programming state in which Vtcg corresponds to a read current of $I_{target}$. In step 3, Vtcg is then measured two or more times for each cell (i.e., measured once in a read operation, and re-measured again at least once in another read operation using the same read operation parameters). One way to measure Vtcg is to place the read potentials on the select gate 24 and drain region 16 (step 3*a*), and ramp the voltage on the control gate 22 up in amplitude until the current through the channel region 18 reaches a certain level of current, 1 µA being an example (i.e., Vtcg corresponds to $I_{target}$ in a read operation) (step 3*b*), as shown in FIG. 4. The detected Vtcg value for each cell is analyzed to determine if fluctuations of Vtcg exceed a predetermined maximum value ΔVtcg, such as 60 mV. For example, it is determined if the measured Vtcg and re-measured Vtcg differ from each other by more than ΔVtcg. FIG. 9 shows that the measured Vtcg and re-measured Vtcg differ from each other by less than ΔVtcg. FIG. 10 shows that the measured Vtcg and re-measured Vtcg differ from each other by more than ΔVtcg. In step 4, memory cells exhibiting a fluctuation of Vtcg that exceeds ΔVtcg are identified as defective.

Once memory cells are identified as defective, one option is to screen them out in any appropriate manner so that they are not used to store data in the future during normal use (step 5). For example, information identifying the screened out (defective) memory cells may be stored locally in the controller 66 or elsewhere in the memory device that is accessible by the controller 66 (e.g., a look up table stored in the memory array), which is then accessed and used by the controller during normal program and read operations so it will not attempt to store or read data in any of the defective memory cells in the future (i.e., they are essentially removed from service as part of the normal program and read operations used to store data to and read data from the memory device). Another known screening technique that can be used with any of the embodiments herein is row or column redundancy, where the memory array includes spare rows or columns of memory cells that are used in place of any rows or columns that are found to contain defective memory cells. Any appropriate screening technique can be used to exclude the defective memory cell(s) from being used. Another option for the screening of defective memory cells is that they can be deeply programmed well beyond the chosen MLC or analog operating range so that they do not contribute to any detected cell current during the operation of the other memory cells in the same memory array (step 6). In this option the addresses of defective memory cells do not need to be permanently stored in any other storage device though these cells will be erased every time before analog programming together with the other memory cells. The controller can apply respective read operation every time before erase to locate deeply programmed defective memory cells and then deeply program them again after erase and before analog programming. Particularly, to distinguish good cells which are not used to store specific analog data (are programmed to Vtcg level above the user operating range) and the defective memory cells, good cells can be programmed to lower Vtcg level than the defective cells but deeply enough to exclude their contribution to read current. All screening options listed above can be applied alone and/or in any combination.

Figure 5:
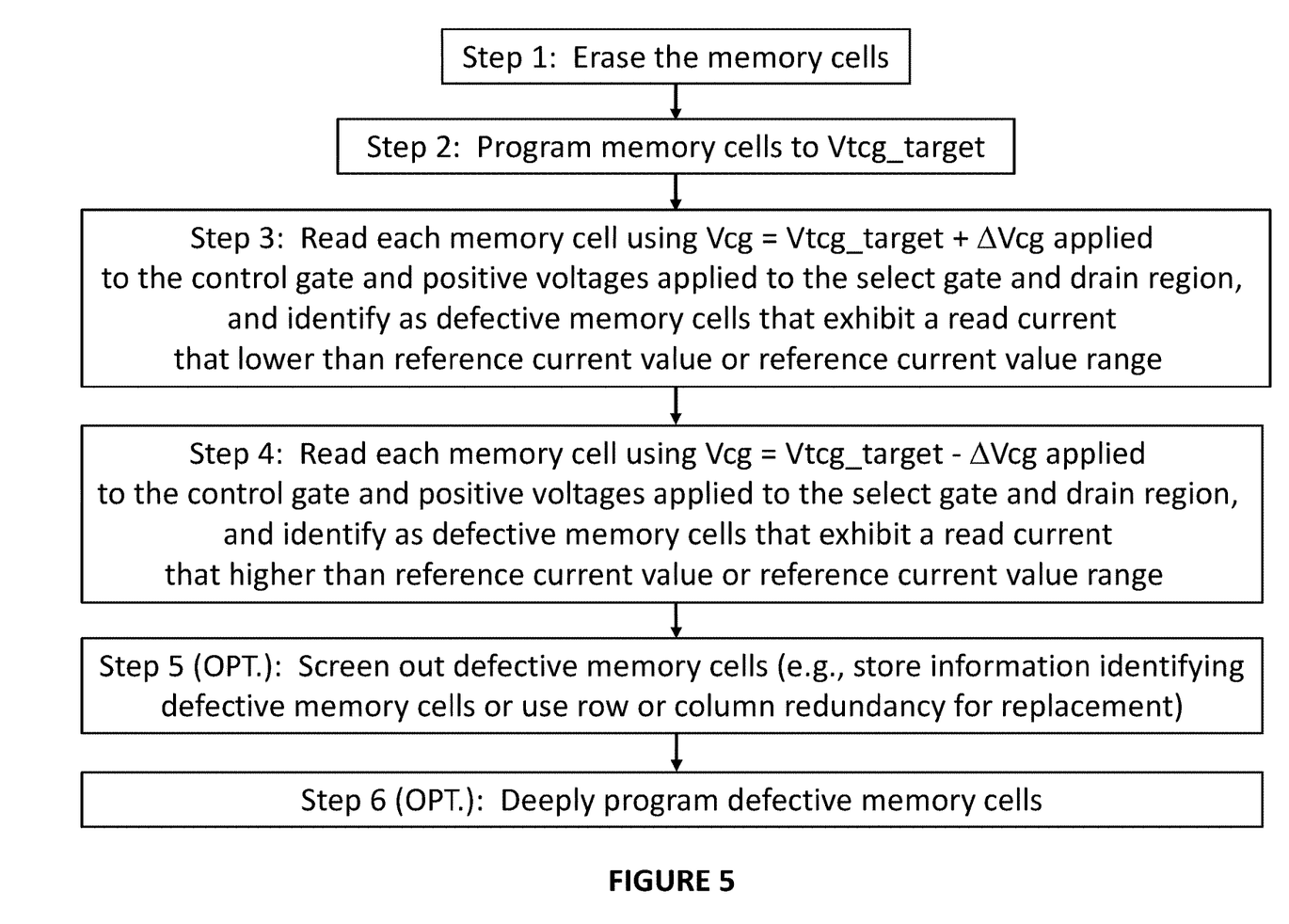
FIG. 5 is a flow diagram showing steps of an alternate embodiment for identifying defective memory cells.
Figure 11:
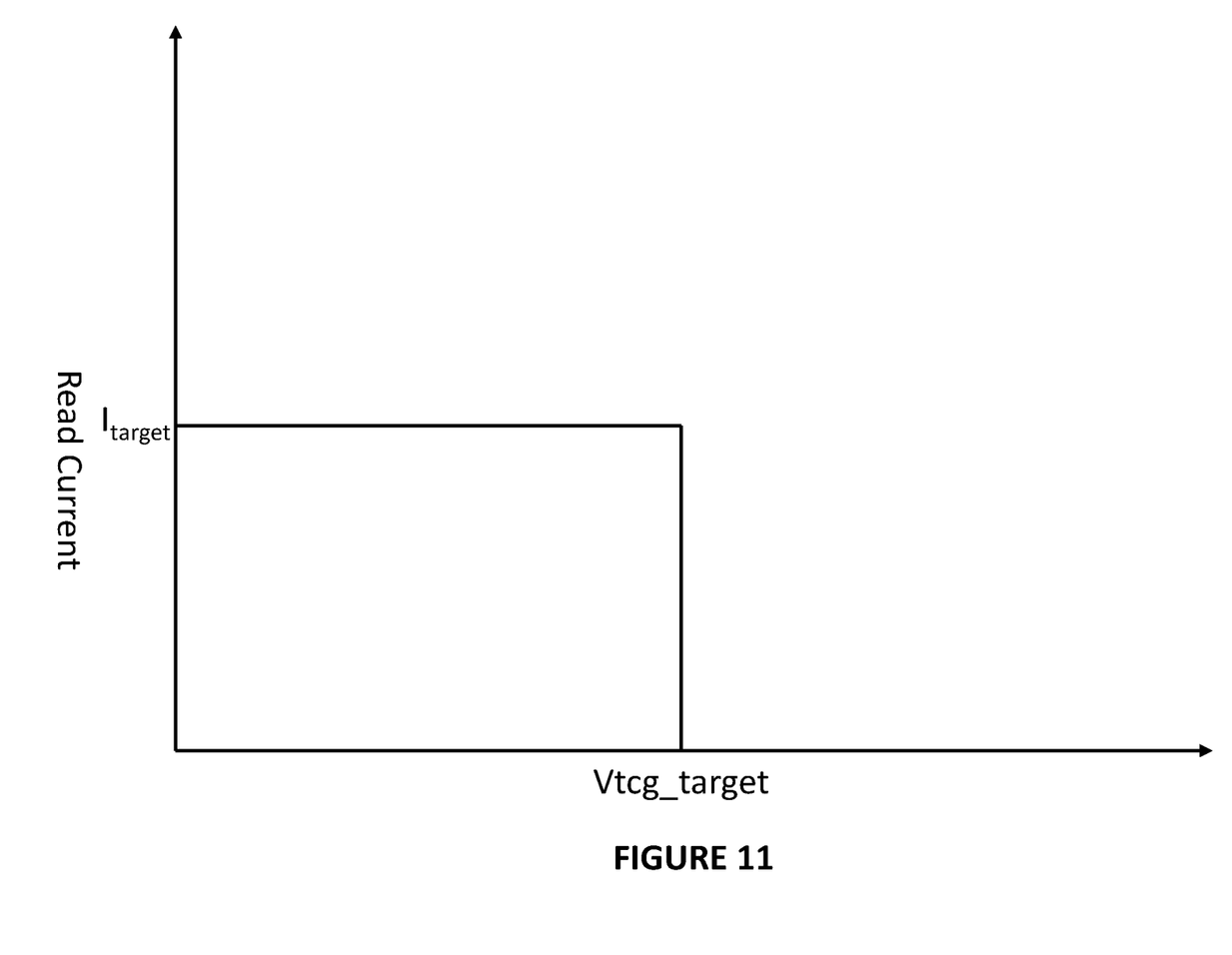
FIG. 11 is a graph showing the memory cell programmed to Vtcg_target to produce a read current of $I_{target}$.
Figure 12:
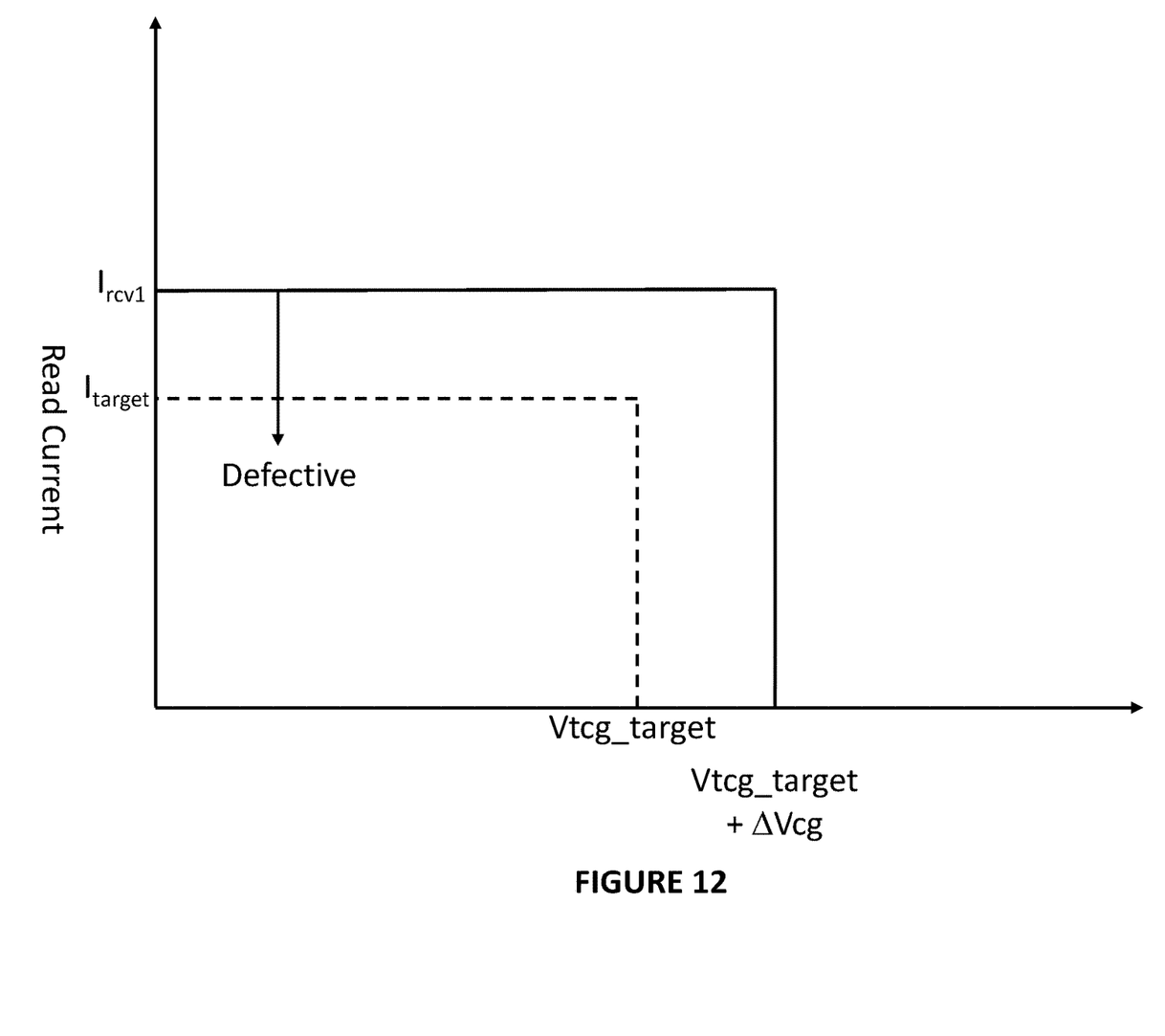
FIG. 12 is a graph showing the memory cell read current using a voltage of Vtcg_target+$\Delta$Vtcg, whereby memory cells producing a read voltage below $I_{rcv1}$ are identified as defective.

An alternative embodiment of the read stabilization technique includes the steps illustrated in FIG. 5 and begins (step 1) by erasing the memory cells 10. Then (step 2), each memory cell is precisely programmed to a desired programming state that exhibits (i.e. corresponds to) a target control gate threshold voltage (Vtcg_target) (i.e. any predetermined threshold voltage which then will be used in subsequent steps described next). See also FIG. 11, which graphically shows the programming state in which Vtcg_target corresponds to a read current of $I_{target}$. Then (step 3), each memory cell is read one or more times using a control gate voltage Vcg that is equal to Vtcg_target+ΔVcg (i.e., a control gate voltage offset from Vtcg_target by a predetermined positive offset value denoted ΔVcg) and compared with a reference current value (i.e., Ircv1) (or otherwise, target current value) or reference (target) current value range, and those memory cells exhibiting, at least once, a read current lower than the reference current value or reference current value range are identified as defective. This is graphically shown in FIG. 12, where memory cells exhibiting a read current below the reference current value $I_{rcv1}$, using a control gate read voltage Vtcg_target+ΔVcg, are identified as defective. In one embodiment, the reference current value is 1 µA or a small range encompassing 1 µA used herein as an example for the Vtcg_target definition. As explained above, during the read operation, the Vcg is applied to the control gate and positive voltages are applied to each of the select gate and drain region. Stable memory cells will provide a current higher than reference current value, or reference (target) current value range, when Vcg is increased by ΔVcg, and thus when a memory cell is unstable enough to produce current lower than the reference current value at least once when Vcg=Vtcg_target+ΔVcg, the memory cell is screened out.

Figure 13:
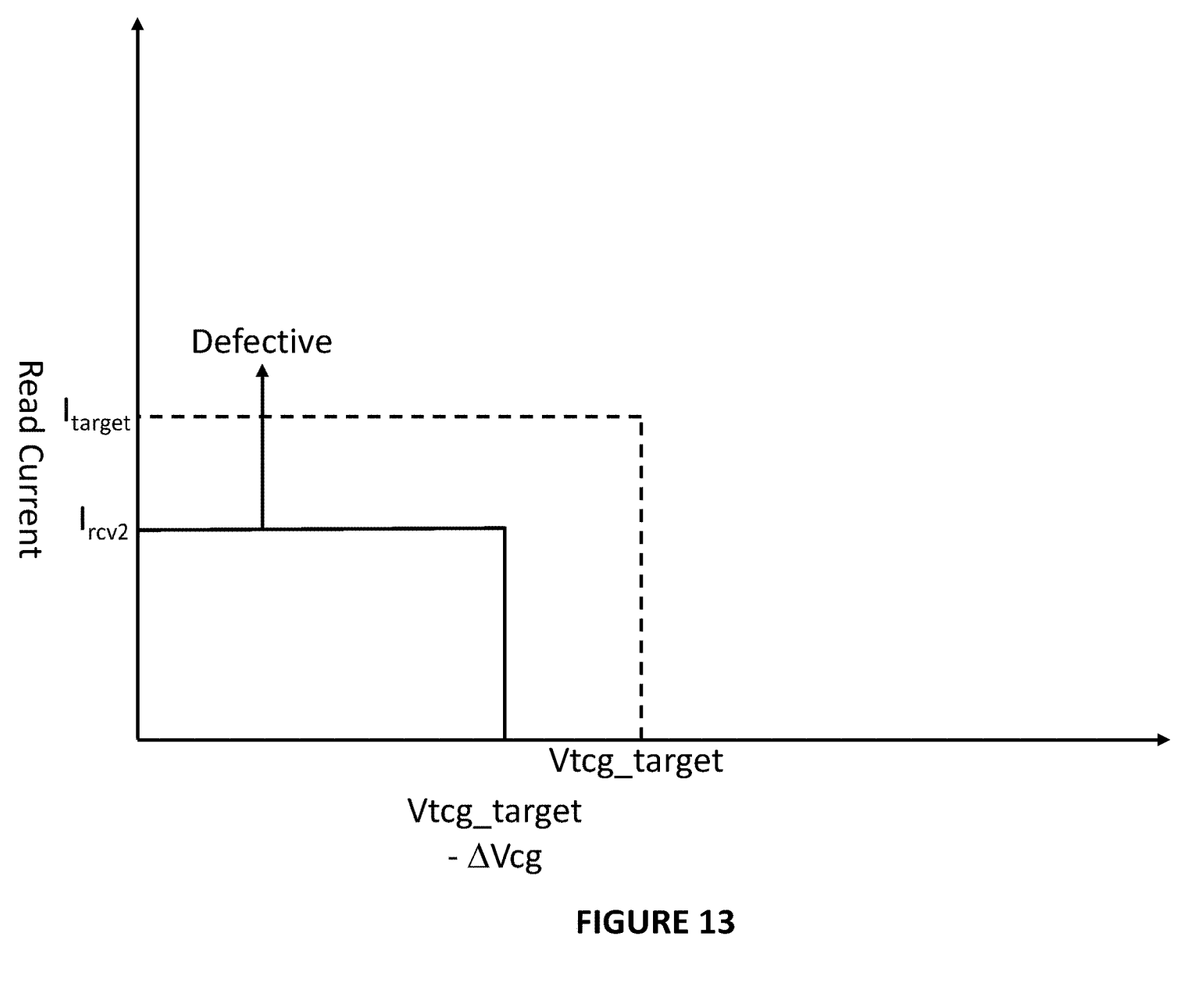
FIG. 13 is a graph showing the memory cell read current using a voltage of Vtcg_target+$\Delta$Vtcg, whereby memory cells producing a read voltage above $I_{rcv2}$ are identified as defective.

In step 4, each memory cell is read again one or more times using a Vcg that is equal to Vtcg_target−ΔVcg (i.e., a control gate voltage offset in the negative direction from Vtcg_target by a predetermined amount) and compared with a reference current value or reference current value range, such as 1 µA or a small range encompassing 1 µA, and those memory cells, at least once exhibiting a read current that is higher than the reference current value or the reference current value range, are identified as defective. This is graphically shown in FIG. 13, where memory cells exhibiting a read current above the reference current value $I_{rcv2}$, using a control gate read voltage Vtcg_target−ΔVcg, are identified as defective. As explained above, during the read operation, the Vcg is applied to the control gate and positive voltages are applied to each of the select gate and drain region. Stable memory cells will provide a current lower than reference current value when Vcg is decreased by ΔVcg, and thus when a memory cell is unstable enough to produce current higher than the reference current value, or reference (target) current value range, at least once when Vcg=Vcg_target−ΔVcg, the memory cell is screened out. Steps 3 and 4 can be performed in the opposite order. Further, for some applications, just one of step 3 or step 4 can be performed instead of both steps, but this option would be less effective. Finally, the defective cells can optionally be screened out (step 5) and/or deeply programmed (step 6) as described above. This alternative embodiment of the read stabilization technique is advantageous compared to the previous one because it is fast, does not require test memory for saving Vtcg data for each memory cell in the array, and can be designed by means of logic data read sensing schematics typically used in flash memory devices. In other words, memory cells with excessive read current instability will be screened out by a logic pass/fail criterion in a fast and efficient way.

Figure 6:
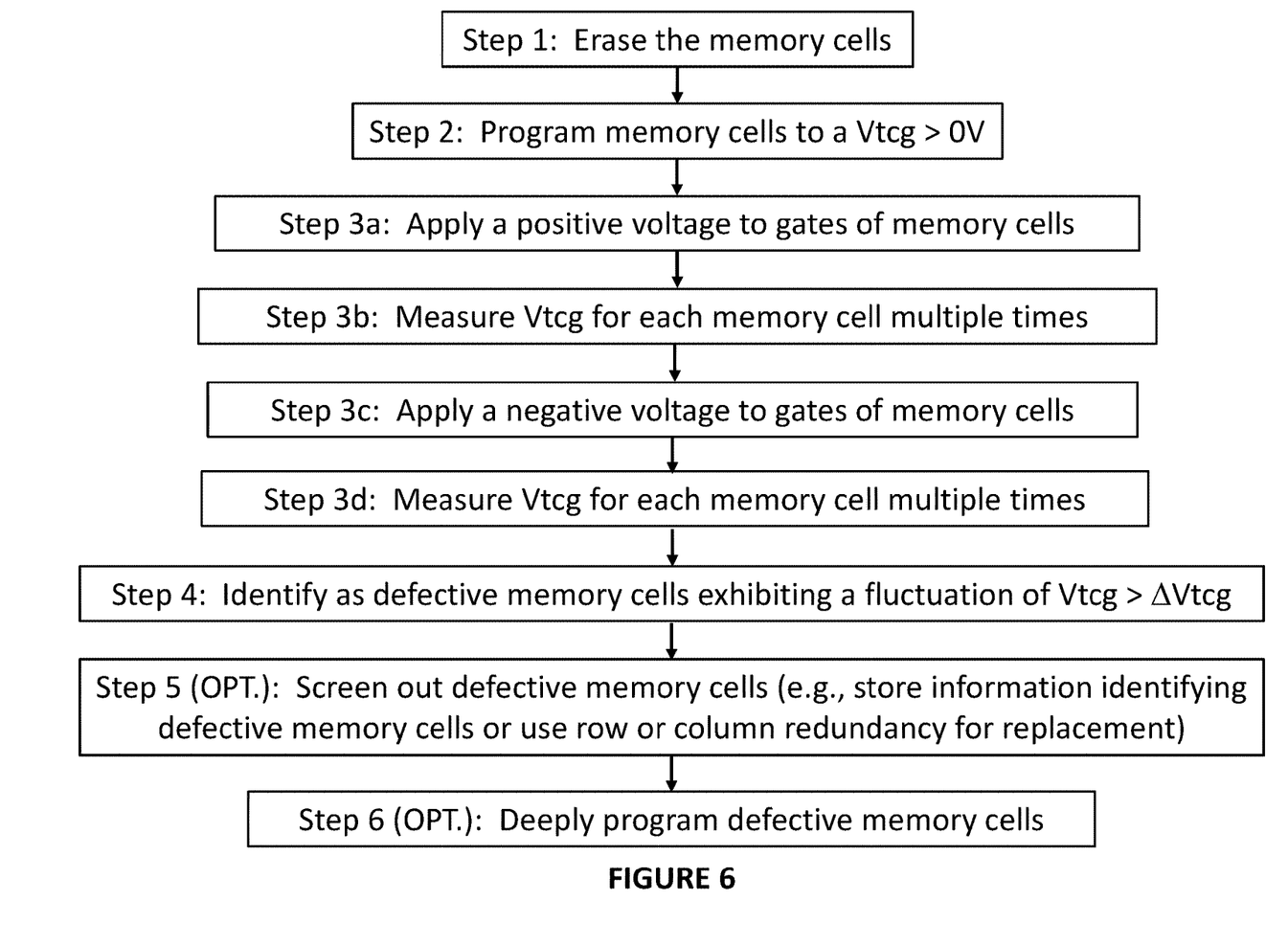
FIG. 6 is a flow diagram showing steps of an alternate embodiment for identifying defective memory cells.

FIG. 6 illustrates another embodiment for identifying defective memory cells where additional steps of applying a voltage to the gates of the memory cells are added in the method of FIG. 3. By means of this modified method, voltages are applied to one or more gates of the memory cells (e.g. the control gate, erase gate, select gate) after programming the memory cells to Vtcg_target, but prior to the measuring of Vtcg. Specifically, a positive voltage applied to the memory cell gates induces electric field stress on the gate oxide of the memory cells, that stimulates electron trapping on the traps at the gate oxide-channel interface of the memory cells. Similarly, a negative voltage applied to the memory cell gates induces electric field stress on the gate oxide of the memory cells, that stimulates the detrapping of electrons from the interface traps. Therefore, for a memory cell that has an interface trap which produces RTN, the positive voltage will stimulate trapping of electrons, setting Vtcg to a higher state. And inversely, the negative voltage will stimulate detrapping of electrons, setting Vtcg to a lower state. Since RTN has erratic behavior, a defective memory cell may stay in only one Vtcg state during all read operations. In this case it will not be screened out. Therefore, application of positive (1 V to 7 V) and negative (−1 V to −7 V) voltages before read (one polarity before each read) will stimulate memory cells with RTN to exhibit both Vtcg states and, thereby, enhance screening efficiency. There is some characteristic time during which memory cells "remember" their RTN state acquired under the applied voltage. The delay between voltage application and read operation should not be longer than typical electron capture and emission time (100 ms at room temperature, as an example), otherwise, application of voltages prior to read operations will be less efficient. A voltage of each polarity, followed by respective read operations, can be applied one time as illustrated in FIG. 6. The sequence of voltage applications of each polarity followed by respective read operations can also be used multiple times to enhance screening efficiency. Moreover, the polarity of the voltages can be reversed (i.e., steps 3c/3d can be performed before steps 3a/3b).

Figure 7:
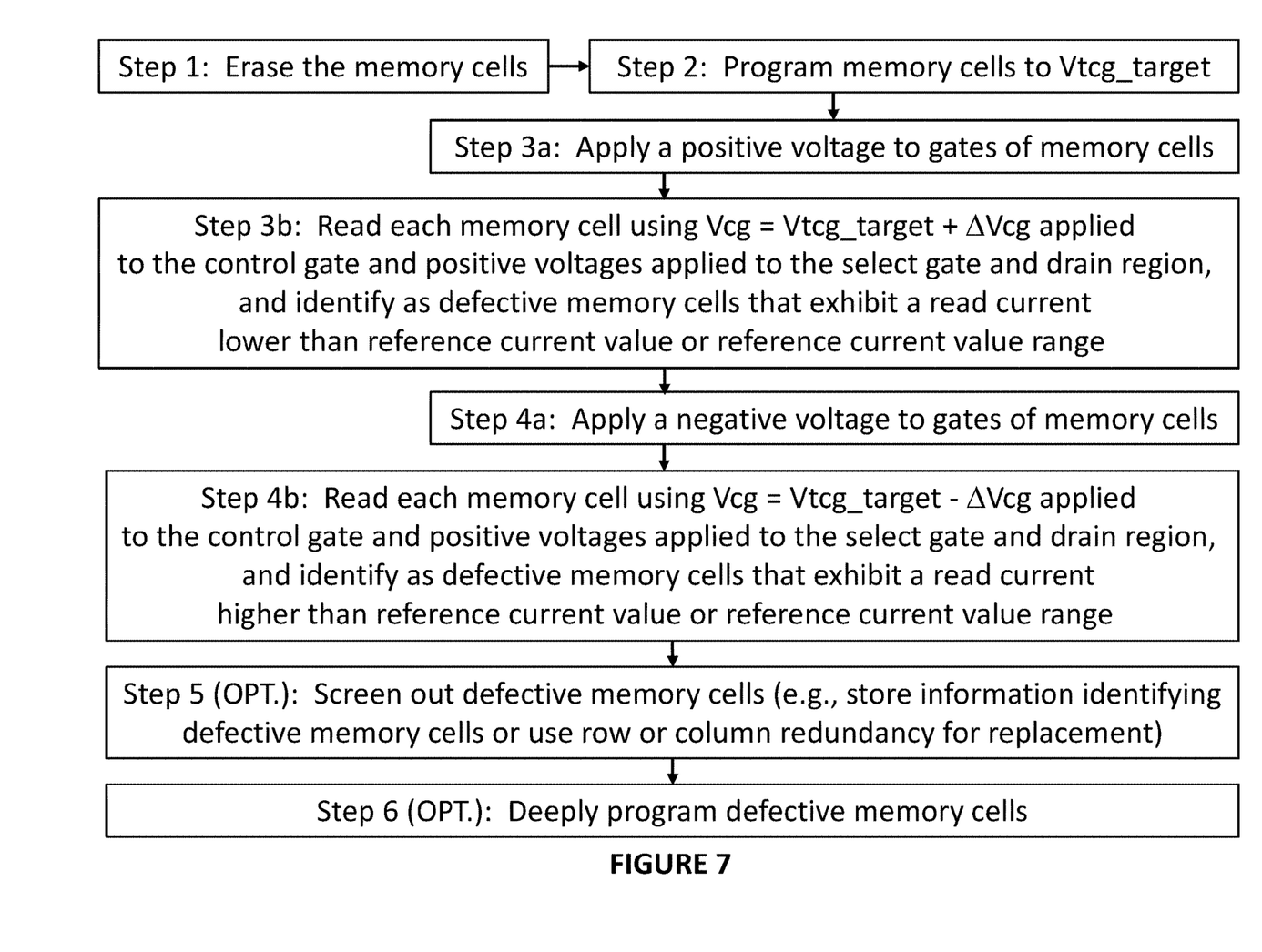
FIG. 7 is a flow diagram showing steps of an alternate embodiment for identifying defective memory cells.

Application of voltages to the gates of the memory cells before read operations can also be used as another embodiment of the method for identifying defective memory cells, which is illustrated in FIG. 7. The method of FIG. 7 is the same as that in FIG. 5, except a positive voltage is applied (step 3a) prior to read at Vcg equal to Vtcg_target+ΔVcg (step 3b), and a negative voltage is applied (step 4a) prior to read at Vcg equal to Vtcg_target−ΔVcg (step 4b). Read at Vtcg_target+ΔVcg (step 3b) is intended to screen out cells which stay in higher Vtcg state (when an electron is trapped on the interface trap) during read. To stimulate trapping of an electron before read, the applied voltage should have positive polarity. And inversely, read at Vtcg_target−ΔVcg (step 4b) is intended to screen out cells which stay in lower Vtcg state (when an electron is emitted from the interface trap) during read. To stimulate detrapping of an electron before read, the applied voltage should have negative polarity. Steps 3 and 4 can be performed in the opposite order. As mentioned in the previous embodiment, the delay between the voltage application and read operation should not be longer than typical electron capture and emission time (100 ms at room temperature, as an example), otherwise, application of voltages prior to read operations will be less efficient. A voltage of each polarity, followed by respective read operation(s), can be applied one time as illustrated in FIG. 7. The sequence of voltage applications of each polarity followed by respective read operation(s) can also be used multiple times to enhance screening efficiency. Moreover, the polarity of the voltages can be reversed (i.e., steps 4a/4b can be performed before steps 3a/3b).

It is to be understood that the present invention is not limited to the embodiment(s) described above and illustrated herein but encompasses any and all variations falling within the scope of any claims. For example, references to the present invention herein are not intended to limit the scope of any claim or claim term, but instead merely relate to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed unless specified. Single layers of material could be formed as multiple layers of such or similar materials, and vice versa. The terms "forming" and "formed" as used herein shall include material deposition, material growth, or any other technique in providing the material as disclosed or claimed. Finally, the present invention could be implemented in an array of memory cells with fewer gates than those in FIG. 1 (e.g., no erase gate).

What is claimed is:

1. A method of operating a memory device that comprises a plurality of non-volatile memory cells, the method comprising:
   erasing the plurality of memory cells,
   programming each of the memory cells, and
   for each of the memory cells:
      measuring a threshold voltage applied to the memory cell corresponding to a target current through the memory cell in a first read operation,
      re-measuring a threshold voltage applied to the memory cell corresponding to the target current through the memory cell in a second read operation,
      identifying the memory cell as defective if a difference between the measured threshold voltage and the re-measured threshold voltage exceeds a predetermined amount, and
      screening out the memory cell identified as defective so that the memory cell is not used to store data.

2. The method of claim 1, wherein each of the memory cells comprises:
   spaced apart source and drain regions formed in a semiconductor substrate, with a channel region of the substrate extending there between,
   a floating gate disposed vertically over and insulated from a first portion of the channel region,
   a select gate disposed vertically over and insulated from a second portion of the channel region, and a control gate disposed vertically over and insulated from the floating gate.

3. The method of claim 2, wherein each of the memory cells further comprises:
an erase gate disposed over and insulated from the source region.

4. The method of claim 2, wherein the measuring of the threshold voltage in the first read operation comprises:
applying positive voltages to the select gate and the drain region; and
applying a voltage to the control gate that ramps up in amplitude until the target current through the memory cell is achieved.

5. The method of claim 4, wherein the re-measuring of the threshold voltage in the second read operation comprises:
applying the positive voltages to the select gate and the drain region; and
applying a voltage to the control gate that ramps up in amplitude until the target current through the memory cell is achieved.

6. The method of claim 2, wherein for each of the memory cells, the measured threshold voltage and the re-measured threshold voltage are applied to the control gate.

7. The method of claim 1, wherein for each of the memory cells identified as defective, the method further comprises:
storing information in the memory device that identifies the memory cell as defective.

8. The method of claim 1, further comprising:
deeply programming the memory cells identified as defective.

9. The method of claim 1, further comprising:
applying a positive voltage or a negative voltage to gates of the memory cells after the programming of the memory cells and before the measuring and re-measuring of the threshold voltages.

10. The method of claim 1, further comprising:
applying a positive voltage to gates of the memory cells after the programming of the memory cells and before the measuring and re-measuring of the threshold voltages, and
applying a negative voltage to gates of the memory cells after the programming of the memory cells, and then for each of the memory cells:
measuring a threshold voltage applied to the memory cell corresponding to a target current through the memory cell in a third read operation,
re-measuring a threshold voltage applied to the memory cell corresponding to the target current through the memory cell in a fourth read operation, and
identifying the memory cell as defective if a difference between the measured threshold voltage in the third read operation and the re-measured threshold voltage in the fourth read operation exceeds a predetermined amount.

11. A method of operating a memory device that comprises a plurality of non-volatile memory cells, the method comprising:
erasing the plurality of memory cells,
programming each of the memory cells to a program state that corresponds to a predetermined threshold voltage of the memory cell, and
for each of the memory cells:
measuring current through the memory cell in a first read operation using a first read voltage applied to the memory cell that is offset from the predetermined threshold voltage by a positive or a negative offset value;
identifying the memory cell as defective if the measured current in the first read operation is lower than, if the offset value is positive, or higher than, if the offset value is negative, a reference current value or a reference current value range; and
screening out the memory cell identified as defective so that the memory cell is not used to store data.

12. The method of claim 11, wherein the offset value is a positive offset value, and wherein for each of the memory cells, the memory cell is identified as defective if the measured current in the first read operation is lower than the reference current value or the reference current value range.

13. The method of claim 12, wherein the for each of the memory cells, the method further comprises:
measuring current through the memory cell in a second read operation using a second read voltage applied to the memory cell that is offset from the predetermined threshold voltage by a negative offset value; and
identifying the memory cell as defective if the measured current in the second read operation is higher than the reference current value or the reference current value range.

14. The method of claim 13, further comprising:
applying a positive voltage to gates of the memory cells after the programming of the memory cells and before the first read operation, and
applying a negative voltage to the gates of the memory cells after the programming of the memory cells and before the second read operation.

15. The method of claim 11, wherein each of the memory cells comprises:
spaced apart source and drain regions formed in a semiconductor substrate, with a channel region of the substrate extending there between,
a floating gate disposed vertically over and insulated from a first portion of the channel region,
a select gate disposed vertically over and insulated from a second portion of the channel region, and
a control gate disposed vertically over and insulated from the floating gate.

16. The method of claim 15, wherein each of the memory cells further comprises:
an erase gate disposed over and insulated from the source region.

17. The method of claim 15, wherein the method further comprises, during the first read operation:
applying positive voltages to the select gate and the drain region.

18. The method of claim 15, wherein for each of the memory cells, the first read voltage is applied to the control gate in the read operation.

19. The method of claim 11, wherein for each of the memory cells identified as defective, the method further comprises:
storing information in the memory device that identifies the memory cell as defective.

20. The method of claim 11, further comprising:
deeply programming the memory cells identified as defective.

* * * * *